(12) United States Patent
Huang (10) Patent No.: US 11,402,694 B2
(45) Date of Patent: Aug. 2, 2022

(54) LIGHT-EMITTING COMPONENT AND DISPLAY APPARATUS

(71) Applicant: HKC CORPORATION LIMITED, Shenzhen (CN)

(72) Inventor: Bei Zhou Huang, Shenzhen (CN)

(73) Assignee: HKC CORPORATION LIMITED, Shenzhen (CN)

(*) Notice: Subject to any disclaimer, the term of this patent is extended or adjusted under 35 U.S.C. 154(b) by 817 days.

(21) Appl. No.: 16/319,480

(22) PCT Filed: Nov. 8, 2018

(86) PCT No.: PCT/CN2018/114479
§ 371 (c)(1),
(2) Date: Jan. 22, 2019

(87) PCT Pub. No.: WO2020/000858
PCT Pub. Date: Jan. 2, 2020

(65) Prior Publication Data
US 2021/0373383 A1    Dec. 2, 2021

(30) Foreign Application Priority Data
Jun. 26, 2018  (CN) .......................... 201820987546.4

(51) Int. Cl.
  *G02F 1/13357* (2006.01)
  *G02F 1/1335* (2006.01)
  *G02F 1/1333* (2006.01)
(52) U.S. Cl.
  CPC .. *G02F 1/133614* (2021.01); *G02F 1/133305* (2013.01); *G02F 1/133607* (2021.01); *G02F 2201/44* (2013.01)

(58) Field of Classification Search
  CPC ................................................. G02F 1/133614
  See application file for complete search history.

(56) References Cited

U.S. PATENT DOCUMENTS

2002/0008807 A1   1/2002  Miyatake et al.
2002/0163606 A1  11/2002  Kitai et al.
(Continued)

FOREIGN PATENT DOCUMENTS

CN     104154468 A    11/2014
CN     104298001 A     1/2015
(Continued)

OTHER PUBLICATIONS

Yuanfeng Fang, the International Searching Authority written comments, dated Feb. 2019, CN.

*Primary Examiner* — Julie A Bannan (57) ABSTRACT

The present application discloses a light-emitting component and a display apparatus. The light-emitting component includes a first diffusion layer, a first prism sheet disposed below the first diffusion layer; a second prism sheet disposed below the first prism sheet; a second diffusion layer disposed below the second prism sheet; a flexible substrate disposed below the second diffusion layer; a second substrate attached to the flexible substrate; an emission layer disposed between the second diffusion layer and the flexible substrate; the emission layer is integrated on the flexible substrate; the emission layer includes a photoluminescence layer and an electroluminescent layer; the photoluminescence layer is disposed between the second diffusion layer and the flexible substrate; and the electroluminescent layer is disposed between the photoluminescence layer and the flexible substrate.

4 Claims, 4 Drawing Sheets

(56) References Cited

U.S. PATENT DOCUMENTS

| | | | |
|---|---|---|---|
| 2007/0096646 A1* | 5/2007 | Van Nice | C09K 11/7787 313/509 |
| 2009/0059554 A1* | 3/2009 | Skipor | G06F 1/3218 362/614 |
| 2011/0096402 A1* | 4/2011 | Sun | G02B 1/04 359/599 |
| 2015/0185395 A1* | 7/2015 | Chang | G02B 6/0018 362/606 |
| 2017/0153362 A1* | 6/2017 | Cho | G02B 5/0226 |
| 2017/0320306 A1* | 11/2017 | Iwase | B32B 7/12 |
| 2018/0067253 A1* | 3/2018 | Ting | G09F 9/35 |
| 2018/0329125 A1* | 11/2018 | Hikita | H05B 33/04 |

FOREIGN PATENT DOCUMENTS

| | | | |
|---|---|---|---|
| CN | 206089537 U | * | 4/2017 |
| CN | 107045227 A | | 8/2017 |
| CN | 107688269 A | | 2/2018 |
| KR | 20160095999 A | * | 8/2016 |

\* cited by examiner

LIGHT-EMITTING COMPONENT AND DISPLAY APPARATUS

The present application claims priority to the Chinese Patent Application No. CN201820987546.4, filed with National Intellectual Property Administration on Jun. 26, 2018, and entitled "LIGHT-EMITTING COMPONENT AND DISPLAY APPARATUS", which is incorporated herein by reference in its entirety.

TECHNICAL FIELD

The present application relates to the technical field of display, and in particular to a light-emitting component and a display apparatus.

BACKGROUND

The statements herein merely provide background information related to the present application but don't constitute the prior art inevitably.

Liquid Crystal Display (LCD).

The LCD is of such a structure that a liquid crystal cell is disposed between two parallel second substrates; a thin film transistor (TFT) is disposed on lower substrate glass, and a color filter is disposed on upper substrate glass; and the rotation direction of liquid crystal molecules is controlled via signals and voltage on the TFT, thereby fulfilling the aim of controlling the emergence of polarized light of each pixel point for displaying.

It can be seen from the structure of the liquid crystal display that the LCD screens each have a layered structure consisting of different parts, regardless of notebook computers or desktop systems. The LCD is composed of two glass plates, with a thickness of 1 mm, which are separated uniformly at intervals of 5 μm by a liquid crystal material. Since the liquid crystal material does not emit light, tubes are disposed on two sides of the display screen as light sources. However, a backlight panel (which can also be referred to as an even-lit panel) and a reflecting film are disposed on the reverse side of the liquid crystal display screen, and the backlight panel is composed of fluorescent materials and can emit light, which achieves the effect of providing a uniform background light source.

The liquid crystal display technology also has weaknesses and technical bottlenecks. Compared with cathode ray tube (CRT) displays, the liquid crystal display has significant gaps in lightness, picture uniformity, visual angle and response time. The response time and the visual angle are closely related to the quality, picture uniformity and auxiliary optical circuits of a display panel.

For the liquid crystal display, lightness tends to be related to a backplate light source thereof. The lightness of the whole liquid crystal display will be improved as the lightness of the backplate light source increases. Signal response time is response delay to a liquid crystal chip of the liquid crystal display. Actually, response time is the time for which the liquid crystal chip is converted from one molecular arrangement state to another molecular arrangement state and should be as short as possible, which indicates the response rate of each pixel point of the liquid crystal display to an input signal, namely the rate at which the screen is changed from dark to bright or from bright to dark. The response time should be shorter, so that smear ghost will not appear when users watch moving frames.

Owing to good color reducibility, high lightness, power saving, easiness in zone control and other advantages, an LED light-emitting component will become the mainstream backlight of the liquid crystal display screen. The LED light-emitting component can be divided into a side-light type LED light-emitting component and a direct-light type LED light-emitting component according to different positions at which the LED is positioned. The direct-light type LED light-emitting component is simple in technology, in which a current-conducting plate is not used, and an LED array is disposed at the bottom of a light box. In order to ensure the uniformity of light, the direct-light type LED light-emitting component is, generally, large in thickness.

For the side-light type LED light-emitting component, a dotted light source is disposed on the side of a specially designed light guide plate as backlight, and there are a few LEDs during application. Since the LEDs are disposed on the side of the product and the uniformity of light can be guaranteed only by arranging the light guide plate, the thickness of the side-light type LED light-emitting component is smaller than that of the direct-light type LED light-emitting component.

However, the direct-light type LED light-emitting component is still used as backlight via two structures, namely the LED and the light guide plate, and the thicknesses of the LED and backlight are still the bottleneck in the lighting and thinning development of light-emitting components.

SUMMARY

The present application provides a light-emitting component and a display apparatus in order to reduce the thickness of a liquid crystal display.

The present application discloses a light-emitting component, which includes:

a first diffusion layer; a first prism sheet disposed below the first diffusion layer; a second prism sheet disposed below the first prism sheet; a second diffusion layer disposed below the second prism sheet; a flexible substrate disposed below the second diffusion layer; a second substrate attached to the flexible substrate; and an emission layer disposed between the second diffusion layer and the flexible substrate and integrated on the flexible substrate, where the emission layer includes a photoluminescence layer and an electroluminescent layer; the photoluminescence layer is disposed between the second diffusion layer and the flexible substrate; and the electroluminescent layer is disposed between the photoluminescence layer and the flexible substrate.

Optionally, the photoluminescence layer is disposed below the second diffusion layer; the electroluminescent layer is disposed below the photoluminescence layer; the substrate is disposed below the electroluminescent layer; the photoluminescence layer is a red-green emission layer; and the electroluminescent layer is a blue emission layer.

Optionally, the emission layer includes a first quantum emission layer, a second quantum emission layer, and a third quantum emission layer, where the photoluminescence layer is disposed below the second diffusion layer; the electroluminescent layer is disposed below the photoluminescence layer; the third emission layer is disposed below the electroluminescent layer; the substrate is disposed below the electroluminescent layer; the photoluminescence layer is a red emission layer; the electroluminescent layer is a green emission layer; and the third emission layer is a blue emission layer.

Optionally, a first transparent electrode is disposed between the photoluminescence layer and the electroluminescent layer; and a second transparent electrode is disposed between the electroluminescent layer and the substrate.

Optionally, a first transparent electrode is disposed between the first quantum emission layer and the second quantum emission layer; a second transparent electrode is disposed between the second quantum emission layer and the third quantum emission layer; and a third transparent electrode is disposed between the third quantum emission layer and the substrate.

Optionally, a reflective layer is disposed below the flexible substrate.

Optionally, hydrogel is also included, and is disposed between the first diffusion layer and the second diffusion layer.

Optionally, a brightness enhancement layer is also included and is disposed between the hydrogel and the second diffusion layer.

The present application further discloses a light-emitting component, which includes: a first diffusion layer; a first prism sheet disposed below the first diffusion layer; a second prism sheet disposed below the first prism sheet; a second diffusion layer disposed below the second prism sheet; an emission layer disposed below the second diffusion layer, where the emission layer includes a photoluminescence layer and an electroluminescent layer; the photoluminescence layer is disposed between the second diffusion layer and a flexible substrate; the electroluminescent layer is disposed between the photoluminescence layer and the flexible substrate; the light-emitting component also includes a flexible substrate, a second substrate, hydrogel and a brightness enhancement layer; the emission layer is disposed on the flexible substrate; the flexible substrate is attached to the second substrate; hydrogel is disposed below the first diffusion layer; and the brightness enhancement layer is disposed below the hydrogel, and the second diffusion layer is disposed below the brightness enhancement layer.

Optionally, the photoluminescence layer is disposed below the second diffusion layer the electroluminescent layer is disposed below the photoluminescence layer; the substrate is disposed below the electroluminescent layer; the photoluminescence layer is a red-green emission layer; the electroluminescent layer is a blue emission layer; the photoluminescence layer includes a first quantum emission layer and a second quantum emission layer; the electroluminescent layer includes a third quantum emission layer; the first quantum emission layer is disclosed below the second diffusion layer; the second quantum emission layer is disposed on one side, which is away from the first diffusion layer, of the first quantum emission layer; the third quantum emission layer is disposed on the second quantum emission layer; the substrate is disposed below the second quantum emission layer; the first quantum emission layer is a red emission layer; the second quantum emission layer is a green emission layer; and the third emission layer is a blue emission layer.

Optionally, a first transparent electrode is disposed between the photoluminescence layer and the electroluminescent layer; and a second transparent electrode is disposed between the electroluminescent layer and the substrate.

Optionally, a first transparent electrode is disposed between the first quantum emission layer and the second quantum emission layer; a second transparent electrode is disposed between the second quantum emission layer and the third quantum emission layer; and a third transparent electrode is disposed between the third quantum emission layer and the substrate.

Optionally, hydrogel is also included, and is disposed between the first diffusion layer and the second diffusion layer; and A reflective layer is disposed below the flexible substrate.

Optionally, the emission layer is attached to the flexible substrate directly via the roll-to-roll process production device.

Optionally, the roll-to-roll process production device includes a control circuit, a driver, a motor, a feeding wheel and an operating chip.

Optionally, the emission layer includes a matrix adhesive, quantum dots, quantum dot microcapsules and diffusion particles.

The light-emitting component is formed by installing the first diffusion layer, the first prism sheet, the second prism sheet, the second diffusion layer, the emission layer and the substrate sequentially. An LED light-emitting source and a light guide plate are replaced with the emission layer, so that a backlight emitting source is simple in structure. Meanwhile, the emission layer, which is used as the backlight emitting source, can be attached to the substrate directly, thereby further reducing the thickness of the light-emitting component, saving an installation technology of the light-emitting component, optimizing the production process and saving labor costs.

BRIEF DESCRIPTION OF DRAWINGS

The drawings are included to understanding of embodiments of the present application, which constitute a part of the specification and illustrate the embodiments of the present application and describe the principles of the present application together with the text description. Apparently, the accompanying drawings in the following description show merely some embodiments of the present application, and a person of ordinary skill in the art may still derive other accompanying drawings from these accompanying drawings without creative efforts. In the accompanying drawings.

DETAILED DESCRIPTION

The specific structure and function details disclosed herein are merely representative and are intended to describe exemplary embodiments of the present application. However, the present application can be specifically embodied in many alternative forms and should not be interpreted to be limited to the embodiments described herein.

In the description of the present application, it should be understood that, orientation or position relationships indicated by the terms "center", "transversal", "upper", "lower", "left", "right", "vertical", "horizontal", "top", "bottom", "inner", "outer", etc. are based on the orientation or position relationships as shown in the drawings, for ease of the description of the present application and simplifying the description only, rather than indicating or implying that the indicated device or element must have a particular orientation or be constructed and operated in a particular orientation. Therefore, these terms should not be understood as a limitation to the present application. In addition, the terms such as "first" and "second" are merely for a descriptive purpose and cannot be understood as indicating or implying relative importance, or implicitly indicating the number of the indicated technical features. Hence, the features defined by "first" and "second" can explicitly or implicitly include one or more features. In the description of the present application, "a plurality of" means two or more, unless otherwise stated. In addition, the term "include" and any variations thereof are intended to cover a non-exclusive inclusion.

In the description of the present application, it should be understood that, unless otherwise specified and defined, the terms "install", "connected with", "connected to" should be comprehended in a broad sense. For example, these terms may be comprehended as being fixedly connected, detachably connected or integrally connected; mechanically connected or coupled; or directly connected or indirectly connected through an intermediate medium, or in an internal communication between two elements. The specific meanings about the foregoing terms in the present application may be understood by those skilled in the art according to specific circumstances.

The terms used herein are merely for the purpose of describing the specific embodiments and are not intended to limit the exemplary embodiments. As used herein, the singular forms "a", "an" are intended to include the plural forms as well, unless otherwise indicated in the context clearly. It will be further understood that the terms "comprise" and/or "include" used herein specify the presence of the stated features, integers, steps, operations, elements and/or components, but do not preclude the presence or addition of one or more other features, integers, steps, operations, elements, components and/or combinations thereof.

The present application will be illustrated optionally in conjunction with the drawings and optional embodiments.

In the present application, the direction in which hydrogel 20 is directed to a first diffusion layer 10 is referred to as the upper part, while the direction in which the first diffusion layer is directed to hydrogel 20 is referred to as the lower part.

Figure 1:
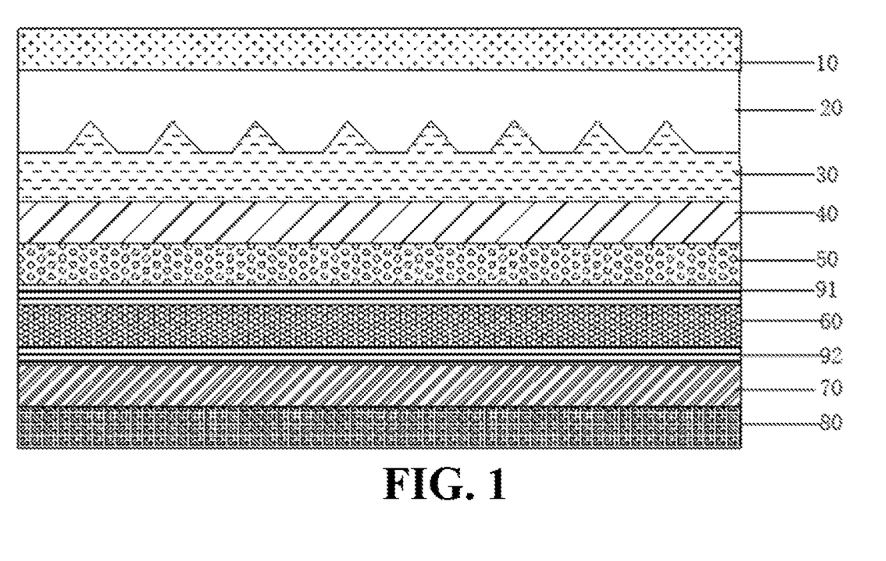
FIG. 1 is a structural schematic diagram of a light-emitting component according to an embodiment of the present application.
Figure 3:
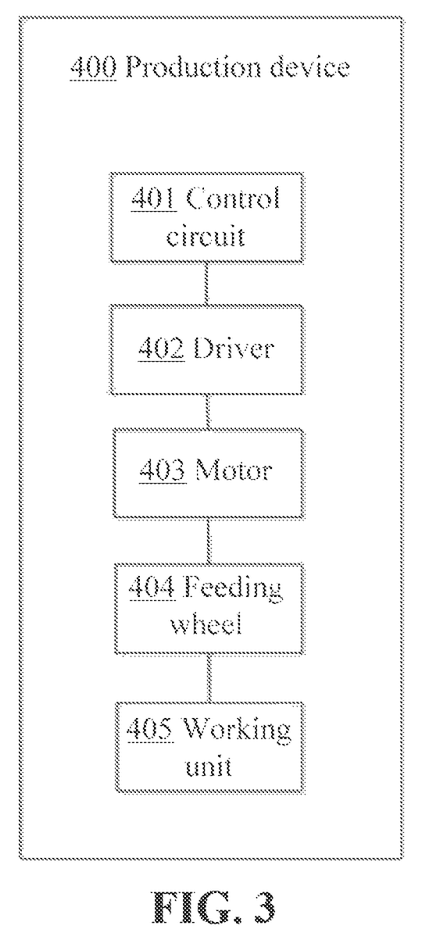
FIG. 3 is a structural schematic diagram of a production device of an RIR technology according to an embodiment of the present application.

As shown in FIGS. 1 and 3, the embodiment of the present application discloses a light-emitting component, which includes a first diffusion layer 10; a first prism sheet disposed below the first diffusion layer 10; a second prism sheet, disposed below the first prism sheet; a second diffusion layer 40 disposed below the second prism sheet; a flexible substrate disposed below the second diffusion layer; a second substrate attached to the flexible substrate; an emission layer disposed between the second diffusion layer 40 and the flexible substrate; the emission layer is integrated on the flexible substrate. The emission layer includes a photoluminescence layer and an electroluminescent layer; the photoluminescence layer is disposed between the second diffusion layer and the flexible substrate; and the electroluminescent layer is disposed between the photoluminescence layer and the flexible substrate.

The light-emitting component is formed by installing the first diffusion layer 10, the first prism sheet, the second prism sheet, the second diffusion layer 40, the emission layer and the flexible substrate 70 sequentially. An LED light-emitting source and a light guide plate are replaced with the emission layer, so that a backlight emitting source is simple in structure. Meanwhile, the emission layer, which is used as the backlight emitting source, can be attached to the flexible substrate 70 directly, thereby further reducing the thickness of the light-emitting component, saving an installation technology of the light-emitting component, optimizing the production process and saving labor costs.

In one or more embodiments, the emission layer includes a matrix adhesive, quantum dots, quantum dot microcapsules and diffusion particles.

Quantum dots are high in stability and long in fluorescence lifetime and can improve the color gamut of white light emitted from the light-emitting component and a display device, and thus, the light-emitting component and the display apparatus can emit light with good color gamut, thereby improving the display effect. Meanwhile, the quantum dot microcapsules with stable luminous efficiency can protect quantum dots, prevent the quenching of the quantum dots, improve the water and oxygen barrier properties of a quantum dot enhancement film, improve the luminous stability of quantum dots and stabilize the luminous efficiency of the quantum dots. The quantum dot microcapsules are matched with the quantum dots, thereby improving the color gamut of the quantum dot enhancement film.

In one or more embodiments, the quantum dot microcapsules include red quantum dot microcapsules and green quantum dot microcapsules, which consist of capsule cores and capsule walls, where the capsule cores of the red quantum dot microcapsules are particles with micropores, to which red quantum dots are adsorbed, while the capsule cores of the green quantum dot microcapsules are particles with micropores, to which green quantum dots are adsorbed. In order to stabilize the red and green quantum dot microcapsules, the quantum dots are dispersed in micropores of organic or inorganic particles with porous structures to form the quantum dot capsule cores; the quantum dot capsule cores are externally wrapped with the capsule walls; and the capsule walls, as protective layers for the quantum dots, implement encapsulation on the quantum dot capsule cores, thereby preventing the quantum dots on the capsule cores from being in contact with moisture or other gases in air, and at the same time, reducing the quenching of the quantum dots caused by contact between the quantum dots and resin as the matrix material or various aids. Generally, since porous particles are organic or inorganic materials, which are stable in heat resistance and solvent resistance, the quantum dots are protected well in the micropores of the porous particles, and the stability is also improved greatly.

As shown in FIG. 1, in one or more embodiments, the emission layer includes a photoluminescence layer 50 and an electroluminescent layer 60, where the photoluminescence layer 50 is disposed below the second diffusion layer 40; the electroluminescent layer 60 is disposed below the photoluminescence layer 50; the flexible substrate 70 is disposed below the electroluminescent layer 60; and the photoluminescence layer 50 is a red-green emission layer, and the electroluminescent layer 60 is a blue emission layer. The blue emission layer is used as first primary color light; red and green quantum emission layers are provided with second primary color quantum dots and third primary color quantum dots; the first primary color light triggers first primary color quantum dots and the third primary color quantum dots to generate white light; and the quantum dots are high in stability and long in service life and can improve the color gamut of light emitted by the light-emitting component. Therefore, the light-emitting component and the display apparatus can emit light with good color gamut, thereby improving the display effect.

In one or more embodiments, a first transparent electrode 91 is disposed between the photoluminescence layer 50 and the electroluminescent layer 60; and a second transparent electrode 92 is disposed between the electroluminescent layer 60 and the flexible substrate 70.

The first transparent electrode 91 is disposed between the photoluminescence layer 50 and the electroluminescent layer 60; the second transparent electrode 92 is disposed between the electroluminescent layer and the flexible substrate 70; the first transparent electrode 91 is matched with the second transparent electrode 92 to generate a light source, so that the photoluminescence layer 50 generates first primary color light, the electroluminescent layer 60 generates second primary color light and third primary color light; and the first primary color light is matched with the second primary color light and the third primary color light to form white light.

Figure 2:
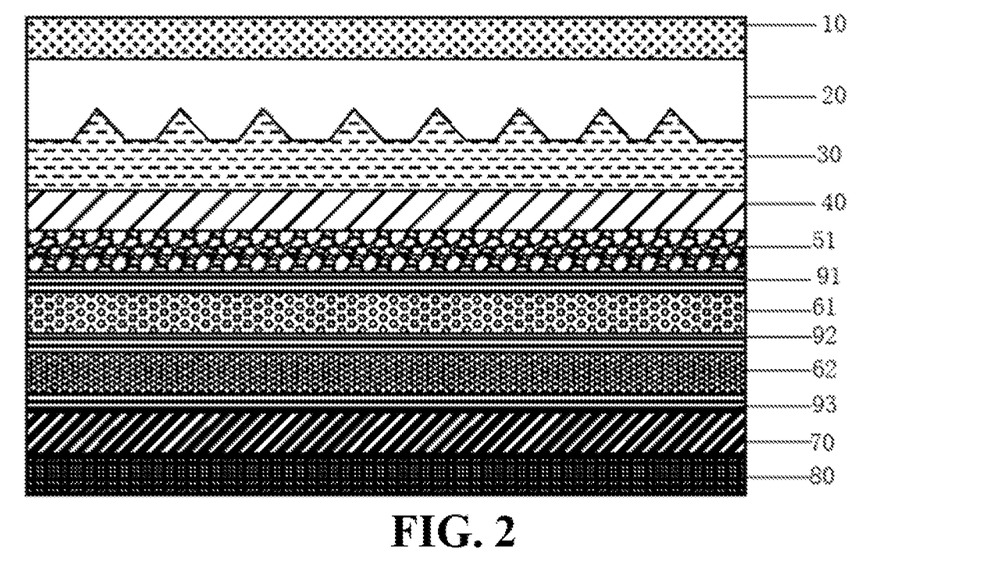
FIG. 2 is another structural schematic diagram of a light-emitting component according to an embodiment of the present application.

As shown in FIG. 2, in one or more embodiments, the emission layer includes a first quantum emission layer 51, a second quantum emission layer 61 and a third quantum emission layer 62; the photoluminescence layer 50 is disposed below the second diffusion layer 40; the electroluminescent layer 60 is disposed below the photoluminescence layer 50; the third emission layer is disposed below the electroluminescent layer 60; the flexible substrate 70 is disposed below the electroluminescent layer 60; and the photoluminescence layer 50 is a red emission layer, the electroluminescent layer 60 is a green emission layer, and third emission layer is a blue emission layer. The blue emission layer of the third quantum emission layer 62 is used as first primary color light; the red quantum emission layer of the first quantum emission layer 51 is provided with second primary color quantum dots; the green quantum emission layer of the second quantum emission layer 61 is provided with third primary color quantum dots; the first primary color light triggers first primary color quantum dots and the third primary color quantum dots to generate white light; and the quantum dots are high in stability and long in service life and can improve the color gamut of light emitted by the light-emitting component. Therefore, the light-emitting component and the display device can emit light with good color gamut, thereby improving the display effect.

In one or more embodiments, the first transparent electrode 91 is disposed between the first quantum emission layer 51 and the second quantum emission layer 61; the second transparent electrode 92 is disposed between the second quantum emission layer 61 and the third quantum emission layer 62; and a third transparent electrode 93 is disposed between the third quantum emission layer 62 and the flexible substrate 70. The second transparent electrode 92 and the third transparent electrode 93 generate the light source, so that the third quantum emission layer 62 generates the first primary color light; the first transparent electrode 91 and the second transparent electrode 92 generate the light source, so that the second quantum emission layer 61 generates second primary color light; the first quantum emission layer 51 is provided with the first primary color light; and the first primary color light is matched with the second primary color light and third primary color light to form white light.

In one or more embodiments, a reflective layer 80 is disposed below the flexible substrate 70.

In one or more embodiments, hydrogel 20 and a brightness enhancement layer 30 are also included, where the hydrogel 20 is disposed below the first diffusion layer 10; the brightness enhancement layer 30 is disposed below the hydrogel 20; and the second diffusion layer 40 is disposed below the brightness enhancement layer 30. The hydrogel 20 is disposed below the first diffusion layer 10, the brightness enhancement layer 30 is disposed below the hydrogel 20, and the second diffusion layer 40 is disposed below the brightness enhancement layer 30, so that the lightness of the light-emitting component is enhanced. Meanwhile, the first diffusion layer 10 is bonded to the brightness enhancement layer 30 using the hydrogel 20. In the method, the apparatus is simple in structure and convenient to install.

Another embodiment of the present application discloses a light-emitting component, which includes a first diffusion layer 10; a first prism sheet disposed below the first diffusion layer 10; a second prism sheet, where the first prism sheet is disposed below the second prism sheet; a second diffusion layer 40 disposed below the second prism sheet; an emission layer disposed below the second diffusion layer 40; and a flexible substrate 70 disposed below the emission layer. The light-emitting component further includes hydrogel 20 and a brightness enhancement layer 30, where the hydrogel 20 is disposed below the first diffusion layer 10; the brightness enhancement layer 30 is disposed below the hydrogel 20; the second diffusion layer 40 is disposed below the brightness enhancement layer 30; the emission layer includes a photoluminescence layer 50 and an electroluminescent layer 60; the photoluminescence layer 50 is disposed below the second diffusion layer 40; the electroluminescent layer 60 is disposed below the photoluminescence layer 50; the flexible substrate 70 is disposed below the electroluminescent layer 60; the photoluminescence layer 50 is a red-green emission layer, the electroluminescent layer 60 is a blue emission layer; a first transparent electrode 91 is disposed between the photoluminescence layer 50 and the electroluminescent layer 60; a second transparent electrode 92 is disposed between the electroluminescent layer 60 and the flexible substrate 70; and a reflective layer 80 is disposed below the flexible substrate 70.

Therefore, the backlight emitting source is simple in structure. Meanwhile, the emission layer, which is used as the backlight emitting source, can be attached to the flexible substrate 70 directly, thereby further reducing the thickness of the light-emitting component, saving an installation technology of the light-emitting component, optimizing the production process and saving labor costs.

As shown in the FIG. 3, in this embodiment, a backlight component is directly attached to a substrate via a production device of an RTR (ROLL TO ROLL) technology. The production device 400 includes a control circuit 401, a driver 402, a motor 403, a feeding wheel 404, and an operating chip 405, where the control circuit 401 controls the driver 402; the driver 402 drives the motor 403 to operate; the motor 403 drives the feeding wheel 404 to transmit the energy emission layer of the light-emitting component to the operating chip 405; and the emission layer is attached to a flexible substrate 70 via the operating chip 405, thereby implementing the installation of the quantum emission layer and the flexible substrate 70 in the light-emitting component. By the production device 400, the production technology is more convenient, and labor costs can be saved.

A display panel in embodiments of the present application may be one of a twisted nematic (TN) display panel or a super twisted nematic (STN) display panel, an in-plane switching (IPS) display panel, a vertical alignment (VA) display panel, a liquid crystal display panel, an OLED display panel, a QLED display panel, a curved surface display panel or other display panels. A driving switch of the present application includes a thin film transistor.

Figure 4:
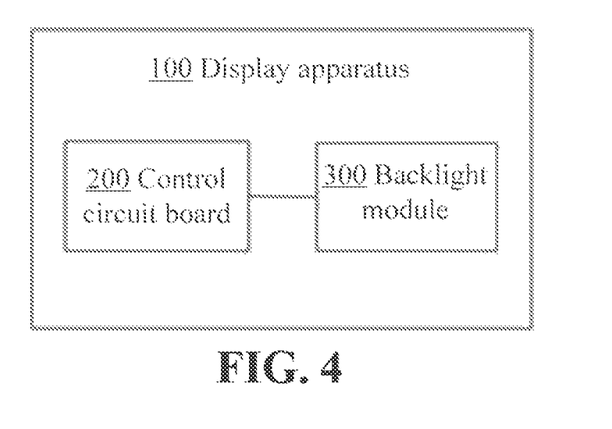
FIG. 4 is a schematic structural diagram of a display apparatus according to an embodiment of the present application.

As shown in FIG. 4, in one or more embodiments of the present application, this embodiment discloses a display apparatus 100, which includes a control circuit board 200 and a light-emitting component 300, where for the specific structure and connected relation of the display apparatus in this embodiment, refer to the display panel 300 in the above embodiment and FIGS. 1-3. We will not make elaboration on the display apparatus.

A display apparatus in the embodiment of the present application may be a liquid crystal display apparatus, a QLED display apparatus, an organic light-emitting diode (OLED) display apparatus or other display apparatuses. When the display apparatus in the embodiment of the present application is the liquid crystal display apparatus, the liquid crystal display apparatus includes a liquid crystal display panel; and the light-emitting component can supply sufficient lightness and light sources with uniform distribution as the light source. The light-emitting component in this embodiment may be divided into a front-light type and a backlight type. It should be understood that the light-emitting component in this embodiment is not limited to the types.

The contents are the optional detailed description to the present application in conjunction with the specific embodiments. The specific embodiments of the present application should not be interpreted to be limited to the descriptions. It will be apparent to a person of ordinary skill in the art that various simple deductions or substitutions may be made without departing from the spirit of the present application and should be considered to fall into the scope of protection of the present application.

What is claimed is:

1. A light-emitting assembly, comprising:
   a first diffusion layer;
   a hydrogel layer disposed beneath and attached to the first diffusion layer;
   a brightness enhancement layer disposed beneath and attached to the hydrogel layer;
   a second diffusion layer disposed beneath and attached to the brightness enhancement layer;
   a flexible substrate disposed below the second diffusion layer;
   a reflective layer disposed beneath and attached to the flexible substrate; and
   an emission layer sandwiched between the second diffusion layer and the flexible substrate and integrated onto the flexible substrate, wherein the emission layer comprises:
   a photoluminescence layer disposed beneath and attached to the second diffusion layer; and
   an electroluminescent layer disposed between the photoluminescence layer and the flexible substrate;
   wherein the photoluminescence layer comprises a first quantum emission layer and a second quantum emission layer; the electroluminescent layer comprises a third quantum emission layer; the first quantum emission layer is disposed below the second diffusion layer, the second quantum emission layer is disposed below the first quantum emission layer, and the third quantum emission layer is disposed below the second quantum emission layer; wherein the flexible substrate is disposed below the third quantum emission layer; wherein the first quantum emission layer is a red emission layer; the second quantum emission layer is a green emission layer; and the third emission layer is a blue emission layer;
   wherein a first transparent electrode is sandwiched between the first quantum emission layer and the second quantum emission layer, a second transparent electrode is sandwiched between the second quantum emission layer and the third quantum emission layer; and a third transparent electrode is sandwiched between the third quantum emission layer and the flexible substrate.

2. A display apparatus, comprising a control circuitry and a light-emitting assembly, wherein
   the light-emitting assembly comprises:
   a first diffusion layer;
   a hydrogel layer disposed beneath and attached to the first diffusion layer;
   a brightness enhancement layer disposed beneath and attached to the hydrogel layer;
   a second diffusion layer disposed beneath and attached to the brightness enhancement layer;
   a flexible substrate disposed below the second diffusion layer;
   a reflective layer disposed beneath and attached to the flexible substrate; and
   an emission layer sandwiched between the second diffusion layer and the flexible substrate and integrated onto the flexible substrate, wherein the emission layer comprises:
   a photoluminescence layer disposed beneath and attached to the second diffusion layer; and
   an electroluminescent layer disposed between the photoluminescence layer and the flexible substrate;
   wherein the photoluminescence layer comprises a first quantum emission layer and a second quantum emission layer; the electroluminescent layer comprises a third quantum emission layer; the first quantum emission layer is disposed below the second diffusion layer, the second quantum emission layer is disposed below the first quantum emission layer, and the third quantum emission layer is disposed below the second quantum emission layer; wherein the flexible substrate is disposed below the third quantum emission layer; wherein the first quantum emission layer is a red emission layer; the second quantum emission layer is a green emission layer; and the third emission layer is a blue emission layer;
   wherein a first transparent electrode is sandwiched between the first quantum emission layer and the second quantum emission layer, a second transparent electrode is sandwiched between the second quantum emission layer and the third quantum emission layer; and a third transparent electrode is sandwiched between the third quantum emission layer and the flexible substrate.

3. The display apparatus according to claim 2, wherein the emission layer is attached to the flexible substrate directly using a roll-to-roll process production device.

4. The display apparatus according to claim 2, wherein the emission layer comprises a matrix adhesive, quantum dots, quantum dot microcapsules, and diffusion particles.

* * * * *